(12) United States Patent
Kuo et al.

(10) Patent No.: US 8,237,272 B2
(45) Date of Patent: Aug. 7, 2012

(54) CONDUCTIVE PILLAR STRUCTURE FOR SEMICONDUCTOR SUBSTRATE AND METHOD OF MANUFACTURE

(75) Inventors: Hung-Jui Kuo, Hsinchu (TW); Chung-Shi Liu, Shin-Chu (TW); Chen-Hua Yu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 311 days.

(21) Appl. No.: 12/706,086

(22) Filed: Feb. 16, 2010

(65) Prior Publication Data

US 2011/0198747 A1  Aug. 18, 2011

(51) Int. Cl.
*H01L 23/48* (2006.01)

(52) U.S. Cl. ........ 257/737; 257/686; 257/698; 257/700; 257/714; 257/734; 438/106; 438/108; 438/109; 438/110

(58) Field of Classification Search ................. None
See application file for complete search history.

(56) References Cited

U.S. PATENT DOCUMENTS

| | | | |
|---|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |

(Continued)

*Primary Examiner* — Kyoung Lee (74) *Attorney, Agent, or Firm* — Lowe Hauptman Ham & Berner, LLP (57) ABSTRACT

A semiconductor component formed on a semiconductor substrate is provided. The semiconductor substrate has a first surface and a second surface. The semiconductor substrate includes a plurality of devices on the first surface. A plurality of through silicon vias (TSVs) in the semiconductor substrate extends from the first surface to the second surface. A protection layer overlies the devices on the first surface of the semiconductor substrate. A plurality of active conductive pillars on the protection layer have a first height. Each of the active conductive pillars is electrically connected to at least one of the plurality of devices. A plurality of dummy conductive pillars on the protection layer have a second height. Each of the dummy conductive pillars is electrically isolated from the plurality of devices. The first height and the second height are substantially equal.

20 Claims, 6 Drawing Sheets

U.S. PATENT DOCUMENTS

| | | |
|---|---|---|
| 7,297,574 B2 | 11/2007 | Thomas et al. |
| 7,335,972 B2 | 2/2008 | Chanchani |
| 7,355,273 B2 | 4/2008 | Jackson et al. |
| 2010/0171226 A1* | 7/2010 | West et al. ............ 257/774 |

* cited by examiner

CONDUCTIVE PILLAR STRUCTURE FOR SEMICONDUCTOR SUBSTRATE AND METHOD OF MANUFACTURE

TECHNICAL FIELD

This disclosure relates generally to semiconductor bump processes, and more particularly to a structure and methods for forming conductive pillars.

BACKGROUND

Flip chip technology plays an important role in the packaging of semiconductor devices. A flip chip microelectronic assembly includes a direct electrical connection of face down electronic components onto substrates, such as circuit boards, using solder bumps as the interconnects. The use of flip chip packaging has dramatically grown as a result of the flip chips advantages in size, performance and flexibility over other packaging methods.

Recently, conductive pillar technology has been developed. Instead of using solder bumps, electronic components are connected to substrates by means of copper pillars. The copper pillar technology achieves a finer pitch with a lower probability of bump |bridging|, reduces the capacitance load of the circuits and allows the electronic components to perform at higher frequencies.

More recently, through-silicon vias (TSV) have arisen as a method of increasing the density of interconnected electronic components. TSV allow for shorter interconnects by forming an interconnect in the z-axis. The interconnect is created through a substrate (e.g. wafer), by forming a via extending from a front surface to a back surface of the substrate. TSV are also useful in forming interconnects for stacked wafers, stacked die, and/or combinations thereof.

However, combining of conductive pillar technology with through-silicon via (TSV) technology presents a number of challenges. In conventional processes, through-silicon vias are formed to extend from the front surface of the substrate into a predetermined depth in the substrate. The conductive pillars are formed on the front surface of the substrate. The through silicon vias are exposed by polishing the back surface of the substrate using CMP. The pressure applied to the back surface is transferred through the pillars on the front surface. But if the pillars are not evenly distributed across the front surface, the pressure applied to the back will not be evenly distributed, result in non-uniform polishing of the back surface. The non-uniform polishing can result in TSVs of varying length, and an uneven backside surface. The non-uniform backside surface would adversely influence subsequent lithography processes on the backside.

Accordingly, what is needed in the art is a formation method for combining conductive pillars with through-silicon vias, so that both the reliability of the manufacturing process and the high degree of integration can be satisfied.

Various embodiments of the present disclosure may be used to moderate the shortcomings of the conventional pillar manufacturing processes. For example, the various embodiments may reduce the depth uniformity of the backside substrate during chemical mechanical polish.

BRIEF DESCRIPTION OF THE DRAWINGS

The disclosure will be described with reference to embodiments thereof as illustrated in the accompanying figures. It should be understood that the drawings are for illustrative purposes and are therefore not drawn to scale.

DETAILED DESCRIPTION

The making and using of illustrative embodiments are discussed in detail below. It should be appreciated, however, that the disclosure provides many concepts that can be embodied in a wide variety of specific contexts. The specific embodiments discussed are merely illustrative and do not limit the scope of the disclosure.

The term "substrate" as described herein, generally refers to a semiconductor substrate on which various layers and devices are formed. The substrate is originally part of a wafer, which is subsequently divided into a plurality of dies, with each die containing a single semiconductor component. The substrate may include silicon or compound semiconductors, such as GaAs, InP, Si/Ge, or SiC. Examples of layers may include dielectric layers, doped layers, metal layers, polysilicon layers and via plugs that may connect one layer to one or more layers.

Figure 1:
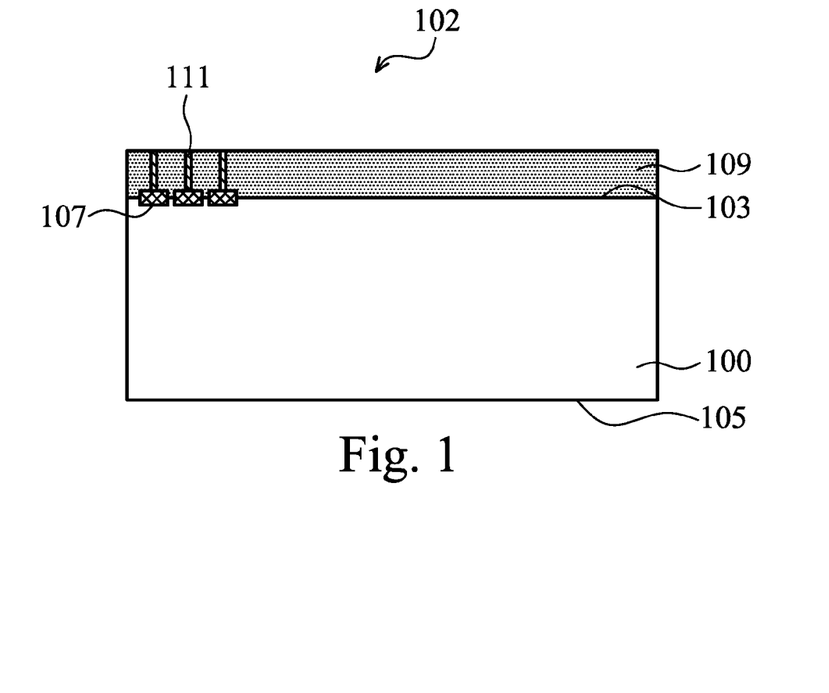
FIG. 1 shows a cross-sectional view of a substrate of a first semiconductor component with a plurality of devices formed on a first surface.

Referring to FIG. 1, a first semiconductor component 102 is formed on a substrate 100. The substrate 100 has a first surface 103 and the second surface 105. A plurality of devices 107 are formed on the first surface 103. Examples of devices may include transistors, resistors, and/or capacitors. An insulating layer 109 is formed over the first surface 103 and covers the plurality of devices 107. One example of such insulating layer 109 may be an oxide layer, or phosphosilicate glass (USG). Contact plugs 111 are formed to extend from the top surface of the insulation layer 109 to the devices 107 for interconnect to the above layer.

Figure 2:
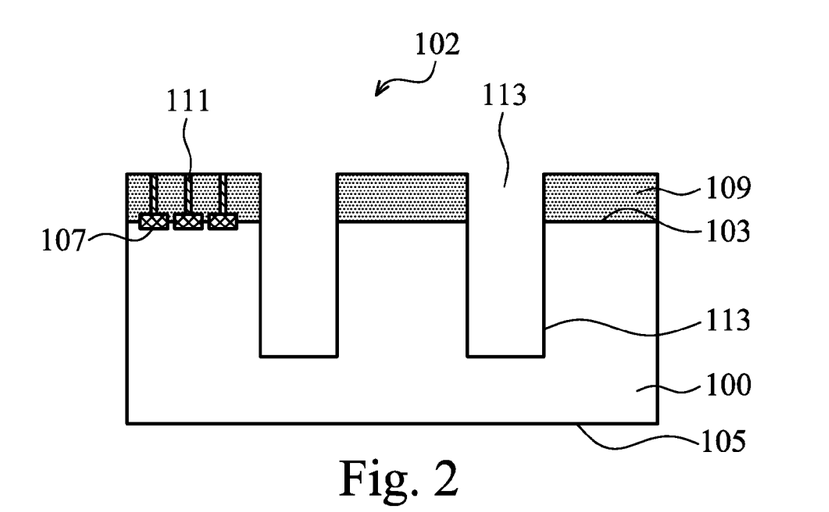
FIG. 2 shows through silicon vias formed through the substrate in FIG. 1.

Referring to FIG. 2, through silicon vias (TSV) 113 are formed by etching through the insulating layer 109, extending through the first surface 103 and into a predetermined depth of semiconductor substrate 100. The etching may be a dry etching process employing a plasma. Alternatively, TSV 113 may be formed by laser drilling.

Figure 3:
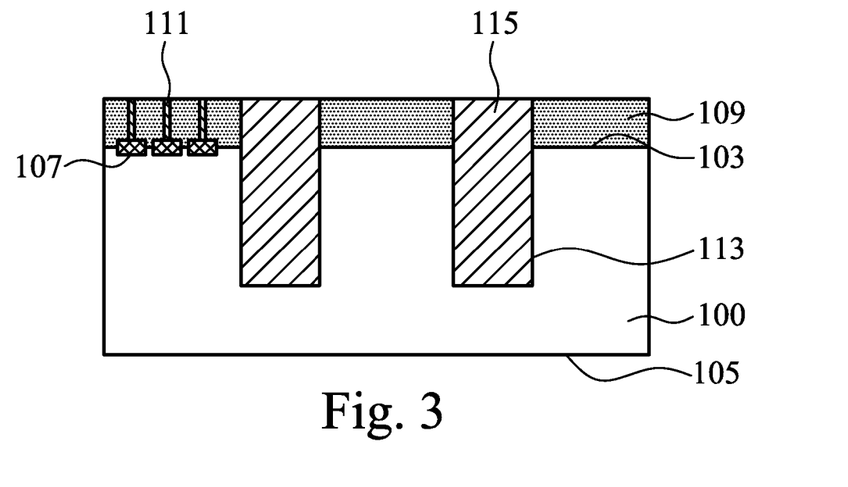
FIG. 3 shows the through silicon vias after they are filled with a conductive material.

Referring to FIG. 3, TSVs 113 are filled with a conductive material 115. The conductive material 115 may include copper or copper alloys. However, other metals, such as aluminum, silver, gold, and combinations thereof, may also be used. The possible formation methods include electroless plating, or other commonly used deposition methods such as sputtering, printing, electro plating, and chemical vapor deposition (CVD). Each of the plurality of devices 107 is connected to at least one of the plurality of TSVs 113 in the substrate 100.

Figure 4:
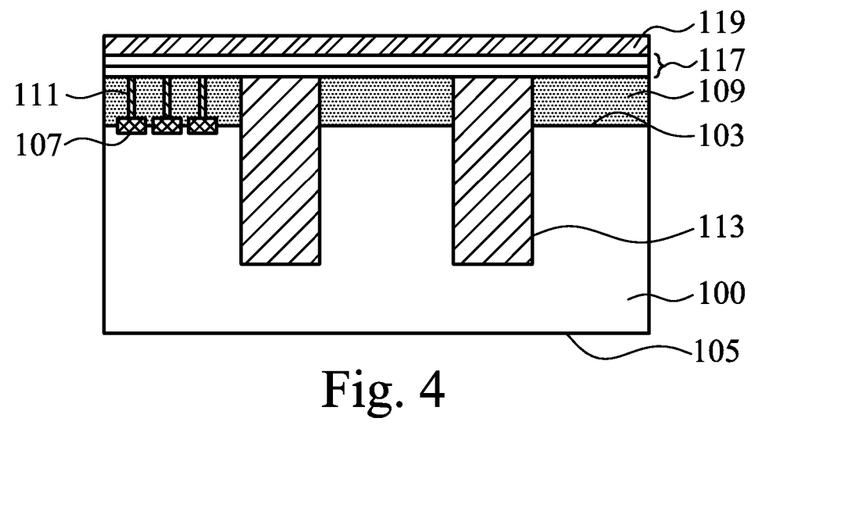
FIG. 4 shows interconnect layers and a protection layer formed over the through silicon vias.

Referring to FIG. 4, interconnect layers 117 are formed on the surface of the through silicon via (TSV) 111. The interconnect layers 117 include one or more layers of conductive layers (not shown) disposed within one or more layers of dielectric layers (not shown). The interconnect layers 117 are formed over devices 107 to make electrical connections from the devices to the upper layers. A protection layer 119 is formed over the interconnect layers 117 to provide protection for the underlying interconnect layers 117. The protection layer 119 may include dielectric material, such as oxide, nitride or any other material, which is familiar to the skilled person in this field.

Figure 5:
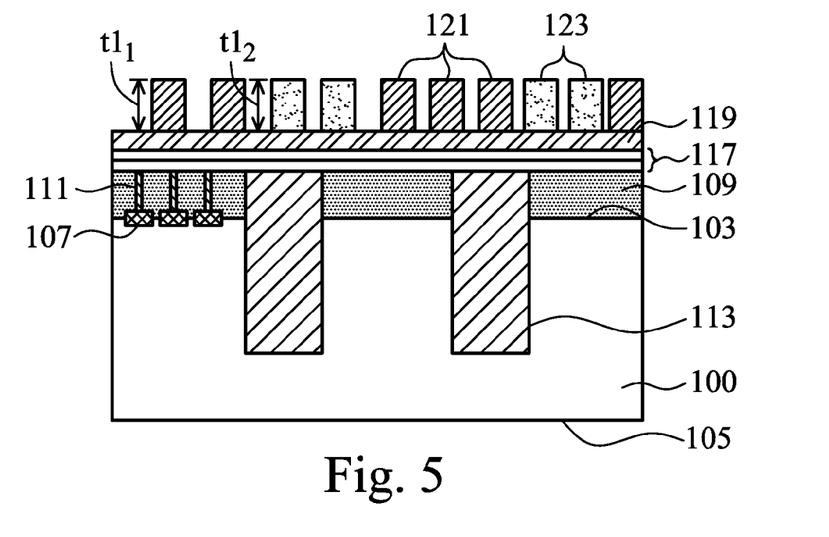
FIG. 5 shows a plurality of active conductive pillars and a plurality of dummy pillars formed on the protection layer.

Referring to FIG. 5, a plurality of active conductive pillars 121 and a plurality of dummy pillars 123 are formed on the protection layer 119. A patterned photo resist layer (not shown) is formed on the protection layer 119 to act as a mold for a metal deposition process. The metal deposition process such as copper electroplating may be used to form the active conductive pillars 121 and dummy pillars 123. In one embodiment, active conductive pillars 121 and dummy pillars 123 are formed in a same process step simultaneously. Alternatively, active conductive pillars 121 and dummy pillars 123 are formed in different process steps. The active conductive pillars 121 and dummy pillars 123 may be formed of copper. Metals or alloys with good thermal conductivity such as gold (Au), silver (Ag), aluminum (AL), Sn—Ag, Sn—Cu are also alternate materials. Each of the plurality of active conductive pillars 121 is electrically connected to at least one of the plurality of devices 107. Although dummy pillars 123 may be formed of electrically conductive material, they are electrically isolated from the plurality of devices 107. The dummy pillars 123 may improve the depth uniformity of the second surface 105 of substrate 100 during a thinning process that will be described later. In one embodiment, each of the plurality of active conductive pillars 121 has a first height H1. Each of the plurality of dummy pillars 123 has a second height H2. The first H1 and second H2 are substantially equal.

Figure 6:
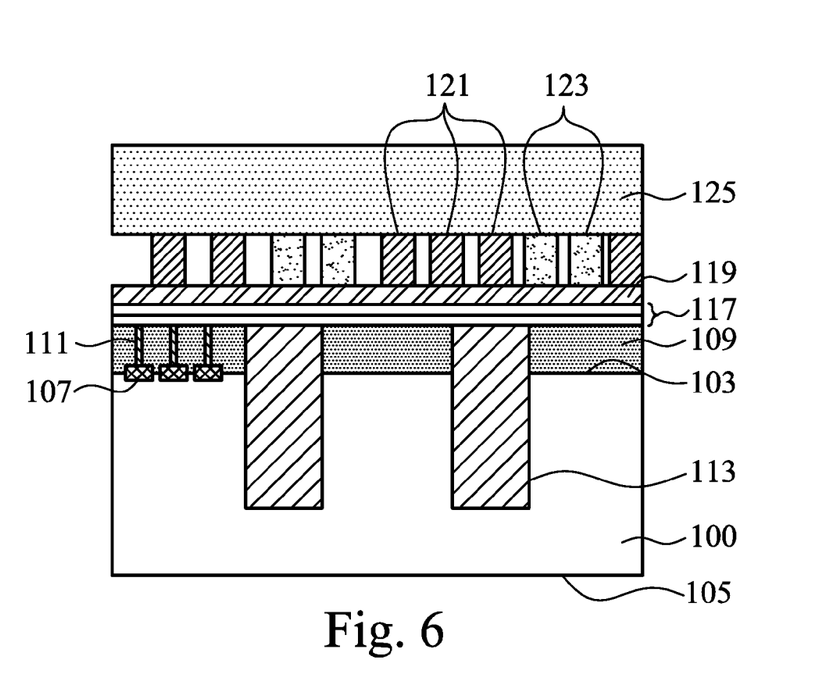
FIG. 6 shows the active conductive pillars and the dummy pillars attached to a carrier.

Referring to FIG. 6, active conductive pillars 121 and dummy pillars 123 are attached to a carrier 125 by using an adhesive. Generally, the carrier 125 provides temporary mechanical and structural support during subsequent processing steps. The base material of the carrier 125 may include glass, silicon, silicon oxide, or other materials.

Figure 7A:
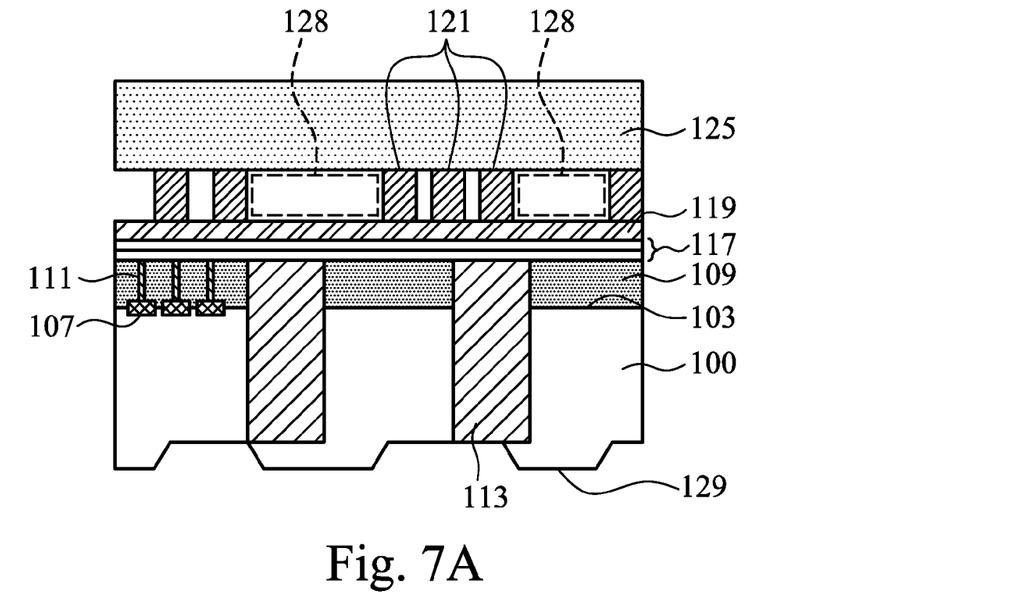
FIG. 7A shows the result of a thinning process performed over the second surface without dummy pillars.
Figure 7B:
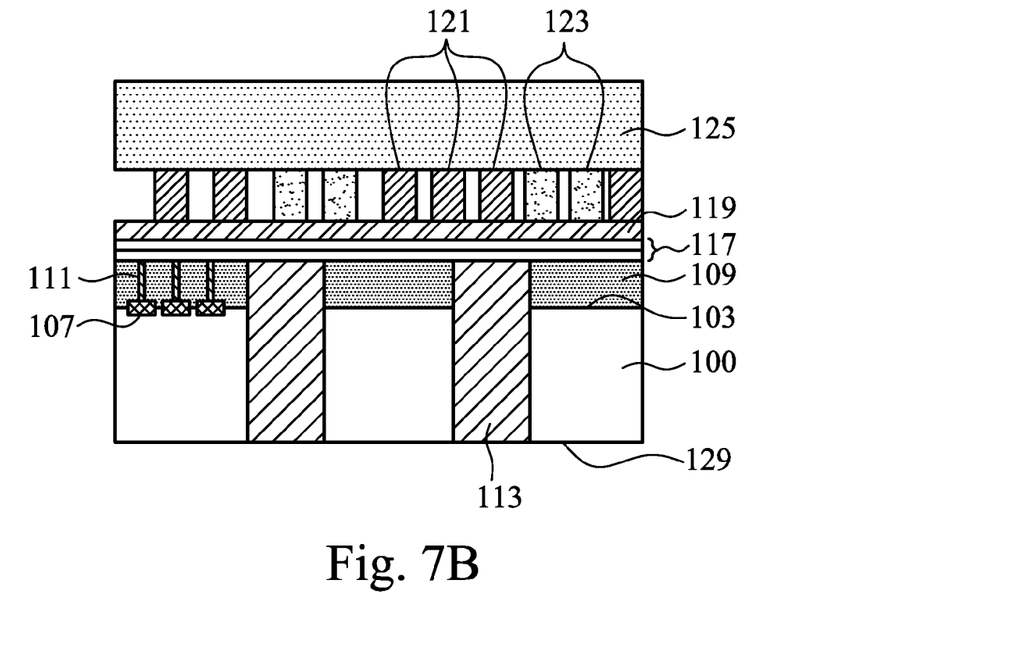
FIG. 7B shows the result of a thinning process performed over the second surface with dummy pillars.

FIG. 7A and FIG. 7B show a thinning process performed over the second surface 105 of the substrate 100 to expose the TSV 113. The first semiconductor component 102 in FIG. 7A has active conductive pillars 121 formed on the protection layer 121 of substrate 100 in a series of rows and columns. Since there are no dummy pillars 123 present to fill empty spaces 128 between adjacent active conductive pillars 121. The active conductive pillars 121 on the substrate 100 are not evenly distributed. During the thinning process, the pressure applied to the second surface 105 to press the second surface 105 against a polishing pad is transferred through active conductive pillars 121 on the first surface 103. If the active conductive pillars 121 are not evenly distributed on the first surface 103, the pressure applied to the second surface 105 will also not be evenly distributed. The effect is that more force is applied to the second surface 105 where there are few active conductive pillars 121 on the first surface 103. This uneven force causes the polished new second surface 129 to be uneven. The uneven backside surface would adversely influence subsequent lithography process on the backside.

Referring to FIG. 7B, in one embodiment, the plurality of dummy pillars 123 are inserted in the empty spaces 128 in FIG. 7A, which do not contain active conductive pillars 121. The dummy pillars 123 are effective in contributing to equal distribution the pressure among all the active conductive pillars 121. Use of dummy pillars 123 improves the uniformity of the new second surface 129 planarized by evenly distributing the pressure to the second surface 105. The new second surface 129 of the substrate 100 gets smooth surface. The uniformly new second surface 129 would enhance capability of the following lithography process on the new second surface 129.

Thereafter, a wet or dry etching process may be performed to from recesses in the new second surface 129 to allow the TSVs 111 to protrude from the new second surface 129 of the substrate 100. The through-silicon vias (TSV) 111 provide electrical connection for the first semiconductor component 102 to other components.

Figure 8:
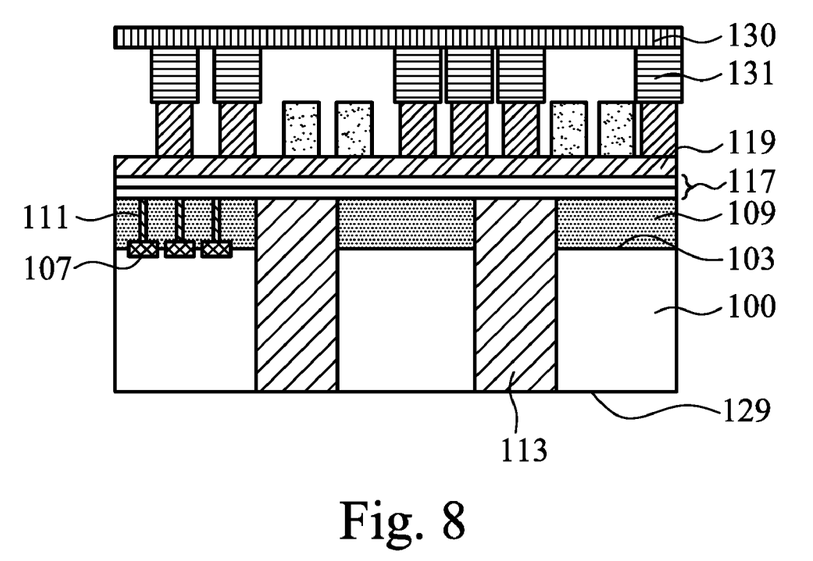
FIG. 8 shows a second component bonded to the first semiconductor component.

Referring to FIG. 8, the first semiconductor component 102 is bonded to a second component 130 using the solder 131. In one embodiment, the second component 130 may be a semiconductor chip, carrier substrate, circuit board or any suitable component familiar to those skilled in the art. The first semiconductor component 102 and the second component 130 could be electrically connected through the active conductive pillars 121. However, the dummy pillars 123 are not in either physical or electrical contact with the second component 130. The bonding methods connecting the first and second components include copper-to-copper bonding, solder bonding or any suitable method familiar to those skilled in the art.

Figure 9:
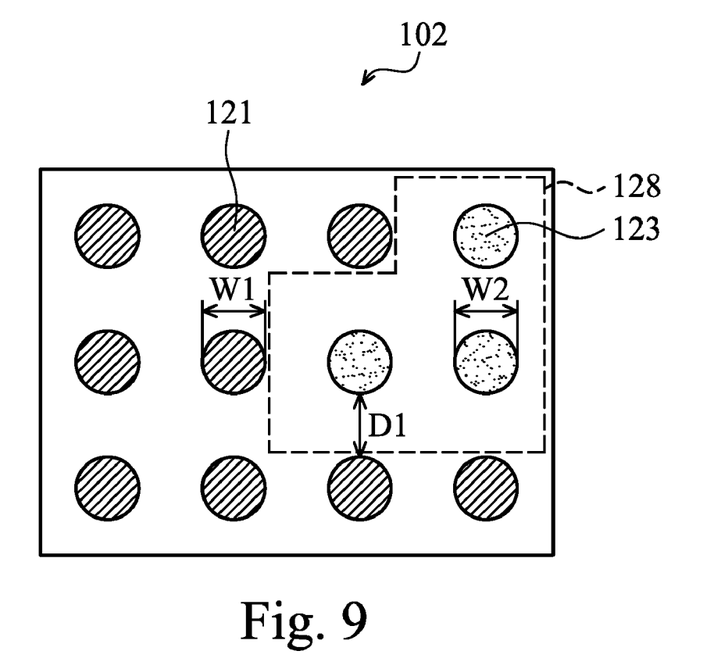
FIGS. 9 to 11 depict top views of possible arrangement of the dummy pillars formed on the substrate.

FIG. 9 to 12 depict top views of example arrangements of the dummy pillars 123 formed on the substrate 100 in accord- ing with embodiments of the disclosure. FIG. 9 illustrates one embodiment of a top view of the layout of the first semiconductor component 102, wherein the dummy pillars 123 are inserted in the empty space 128 among the conductive pillars 121 as shown in FIG. 7A. The cross-section of the dummy pillars 123 may be various shapes, for example a circle, a square or a rectangle. In this embodiment, the active conductive pillars 121 are arranged in a rows and column pattern with an empty space 128. Each of the circular active conductive pillars 121 has a first width W1, and each of the circular dummy pillars 123 has a second width W2. A ratio of the first width W1 to the second width W2 is about 0.9 to about 1.1. A distance D1 between any of the plurality of active conductive pillars 121 and any of the plurality of dummy pillars 123 is greater than or equal to the first width W1

Figure 10:
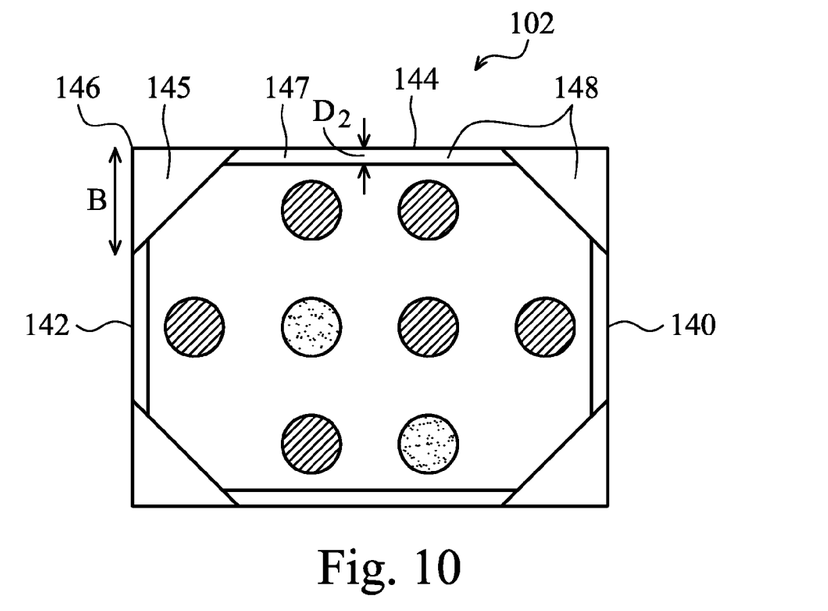

FIG. 10 illustrates another embodiment of the top view of the layout of the first semiconductor component 102. The first semiconductor component 102 is on a rectangular die 140. The die 140 has two edges 142, 144 extending from each corner 146, formed by a right angle, of the die 140. A forbidden region 148, which does not contain any active conductive pillar 121 and any dummy pillar 123, is in the substrate 100. The forbidden region 148 includes a triangular region 145 near each corner 146 of the die 140 and a region 147 adjacent to each edge of the die 140. The triangular region 145 is defined by a length B extending from the corner 146 along two edges 142, 144. The length B is greater than or equal to 1.8 of the first width W1. The region 147 adjacent to the edges is within a predetermined distance D2 from each edge 142, 144 of the die 140. When a die size is larger than 15 mm$^2$, the predetermined distance D2 is greater than or equal to 0.7 of the first width W1. When a die size is smaller than 15 mm$^2$, the predetermined distance D2 is greater than or equal to 0.5 of the first width W1.

Figure 11:
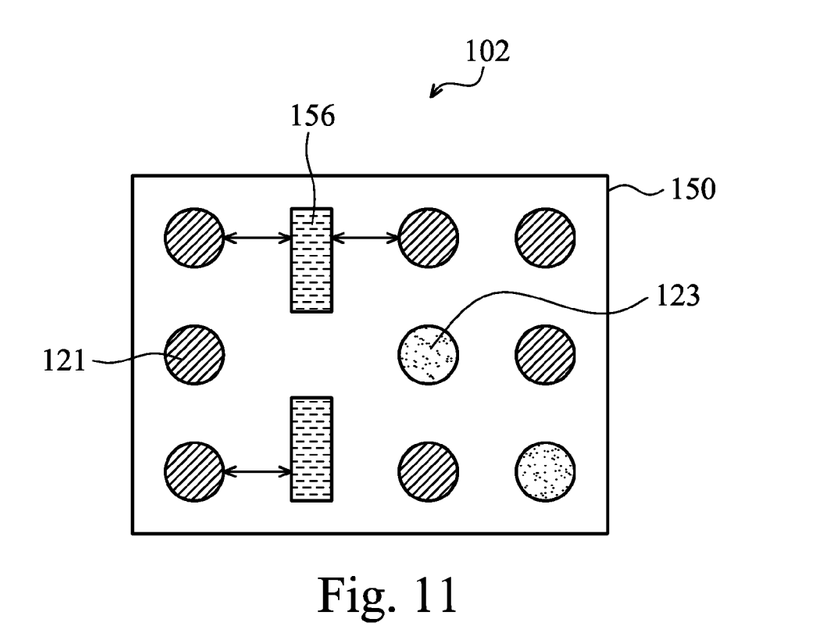

FIG. 11 illustrates a top view of another embodiment of the layout of the semiconductor component 102 on a die 150. Die 150 includes active conductive pillars 121, dummy pillars 123 and electrical fuses 156 on the protection layer 119. The electrical fuses 156 are current interrupting devices, which protect devices 107 from damage in response to excessive current. A distance D3 between any of active conductive pillars 121 and any of dummy pillars 123 to an adjacent electrical fuse 156 is greater than or equal to 0.65 of the first width W1

Although the present embodiments and the advantages of the present embodiments have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A first semiconductor component comprising:
   a semiconductor substrate having a first surface and a second surface, wherein the semiconductor substrate includes a plurality of devices on the first surface;
   a plurality of through silicon vias (TSVs) in the semiconductor substrate extending from the first surface to the second surface;
   a protection layer overlying the devices on the first surface of the semiconductor substrate;
   a plurality of active conductive pillars on the protection layer having a first height, wherein each of the active conductive pillars is electrically connected to at least one of the plurality of devices; and
   a plurality of dummy conductive pillars on the protection layer having a second height, wherein each of the dummy conductive pillars is electrically isolated from the plurality of devices;
   wherein the first height and the second height are substantially equal.

2. The first semiconductor component of claim 1, wherein each of the plurality of active conductive pillars has a first width, each of the plurality of dummy pillars has a second width, a ratio of the first width to the second width is about 0.9 to about 1.1.

3. The first semiconductor component of claim 2, wherein a distance between any of the plurality of active conductive pillars and any of the plurality of dummy pillar is greater than or equal to the first width.

4. The first semiconductor component of claim 2, wherein the substrate comprises a plurality of rectangular die, and a forbidden region of each die does not contain any conductive pillar and any dummy pillar, wherein the forbidden region is a triangular region defined by a right triangle formed by the right angle of a corner of the die with two edges extending a length B from the corner along the edges of the die, the length B is greater than or equal to 1.8 of the first width.

5. The first semiconductor component of claim 4, wherein the forbidden region further comprises a region within a predetermined distance from the edge of a die.

6. The first semiconductor component of claim 5, wherein the predetermined distance is greater than or equal to 0.7 of the first width when a die size is larger than 15 mm$^2$.

7. The first semiconductor component of claim 5, wherein the predetermined distance is greater than or equal to 0.5 of the first width when a die size is smaller than 15 mm$^2$.

8. The first semiconductor component of claim 2, further comprising a plurality of fuses on the protection layer, wherein a minimum distance between any conductive pillar and any dummy pillar to an adjacent fuse is greater than or equal to 0.65 the first width.

9. The first semiconductor component of claim 1, further comprising a second semiconductor component electrically connected to the plurality of devices on the first semiconductor component through the plurality of active conductive pillars, while dummy pillars are not in contact with the second semiconductor component.

10. The first semiconductor component of claim 1, wherein each of the plurality of devices is electrically connected to at least one of the plurality of TSVs in the semiconductor substrate.

11. A method of forming conductive pillars to a first semiconductor component, the method comprising:
   providing a semiconductor substrate, the substrate having a first surface and a second surface, wherein the semiconductor substrate include a plurality of devices on the first surface;
   forming a plurality of through silicon vias (TSVs) in the semiconductor substrate extending from the first surface to the second surface;
   forming a protection layer on the first surface of the semiconductor substrate;
   forming a plurality of active conductive pillars on the protection layer, wherein each of the plurality of active conductive pillars has a first height and is electrically connected to at least one of the plurality of devices;
   forming a plurality of dummy conductive pillars on the protection layer, wherein each of the plurality of dummy conductive pillars has a second height and is electrically isolated from the plurality of devices;
   wherein the first height and the second height are substantially equal.

12. The method of claim 11, wherein each of the plurality of active conductive pillars has a first width, each of the plurality of dummy pillars has a second width and a ratio of the first width to the second width is about 0.9 to about 1.1.

13. The method of claim 11, further comprising:
   thinning the second surface of the substrate to expose TSVs.

14. The method of claim 11, further comprises a second component electrically connected to the plurality of devices on the first semiconductor component through the plurality of active conductive pillars, while dummy pillars are not in contact with the second component.

15. The method of claim 12, wherein a distance between any of the plurality of active conductive pillars and any of the plurality of dummy pillars is greater than or equal to the first width.

16. The method of claim 12, wherein the substrate comprises a plurality of rectangular dies, and a forbidden region within each die that does not contain any active conductive pillars or dummy pillars, wherein the forbidden region comprises a triangular region defined by a right triangle formed by the right angle of a corner of each die with two edges extending a length B from the corner along the edges of the die, the length B being greater than or equal to 1.8 of the first width.

17. The method of claim 16, wherein the forbidden region further comprises a region within a predetermined distance from a one of the edges of each of the dies.

18. The method of claim 17, wherein the predetermined distance is greater than or equal to 0.7 of the first width when a die size is larger than 15 mm$^2$.

19. The method of claim 17, wherein the predetermined distance is substantially equal to 0.5 of the first width when a die size is smaller than 15 mm$^2$.

20. The method of claim 11, wherein each of the plurality of devices is electrically connected to at least one of the plurality of TSVs in the semiconductor substrate.

* * * * *